United States Patent
Kawaguchi et al.

(10) Patent No.: US 9,130,063 B2
(45) Date of Patent: Sep. 8, 2015

(54) SEMICONDUCTOR DEVICE AND METHOD OF MANUFACTURING THE SAME

(71) Applicant: Sanken Electric Co., LTD., Niiza-shi, Saitama (JP)

(72) Inventors: Hiroko Kawaguchi, Niiza (JP); Hiromichi Kumakura, Niiza (JP); Satoru Washiya, Niiza (JP); Toru Yoshie, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/496,617

(22) Filed: Sep. 25, 2014

(65) Prior Publication Data
US 2015/0091022 A1  Apr. 2, 2015

(30) Foreign Application Priority Data
Sep. 30, 2013 (JP) .................. 2013-204868

(51) Int. Cl.
| | |
|---|---|
| H01L 27/095 | (2006.01) |
| H01L 29/47 | (2006.01) |
| H01L 29/812 | (2006.01) |
| H01L 31/07 | (2012.01) |
| H01L 31/108 | (2006.01) |
| H01L 29/872 | (2006.01) |
| H01L 29/45 | (2006.01) |
| H01L 21/283 | (2006.01) |
| H01L 29/16 | (2006.01) |

(52) U.S. Cl.
CPC ............ *H01L 29/872* (2013.01); *H01L 21/283* (2013.01); *H01L 29/45* (2013.01); *H01L 29/47* (2013.01); *H01L 29/1608* (2013.01)

(58) Field of Classification Search
CPC ................... H01L 29/66136; H01L 29/66143; H01L 29/66174; H01L 29/66212; H01L 29/7806; H01L 29/872; H01L 2924/12032
See application file for complete search history.

(56) References Cited

U.S. PATENT DOCUMENTS

2011/0233563 A1*  9/2011  Sugai et al. ..................... 257/77

FOREIGN PATENT DOCUMENTS

JP  2011-165880 A  8/2011

* cited by examiner

*Primary Examiner* — Hoai V Pham
(74) *Attorney, Agent, or Firm* — Banner & Witcoff, Ltd.

(57) ABSTRACT

A semiconductor device having a main electrode connected to a first semiconductor region and a second semiconductor layer on a semiconductor substrate so that a pn-junction diode is formed with the first semiconductor region being interposed and a Schottky barrier diode is formed with the second semiconductor layer being interposed on a surface of the semiconductor substrate, the semiconductor device includes a first electrode configured to ohmic-contact the first semiconductor region; a second electrode configured to Schottky-contact the second semiconductor layer and not having a portion directly contacting the first electrode; and a conductive reaction suppression layer to suppress a reaction between a material configuring the first electrode and a material configuring the second electrode are provided on the surface of the semiconductor substrate, and the main electrode is electrically connected to the first electrode and the second electrode.

8 Claims, 4 Drawing Sheets

SEMICONDUCTOR DEVICE AND METHOD OF MANUFACTURING THE SAME

CROSS-REFERENCE TO RELATED APPLICATION

This application claims priority from Japanese Patent Application No. 2013-204868 filed on Sep. 30, 2013, the entire subject matter of which is incorporated herein by reference.

BACKGROUND

This disclosure relates to a structure of a semiconductor device having a main electrode on a surface of a semiconductor substrate and configured to function as a diode, and a method of manufacturing the same.

Silicon carbide (SiC) is used as a material of a power semiconductor device, and particularly, a SiC Schottky barrier diode is widely used. However, the SiC Schottky barrier diode has a problem that it is may be broken down by a forward surge current. In order to solve the problem, a diode having an MPS (Merged PIN Schottky) structure as disclosed in JP-A-2011-165880 is used, for example. In the MPS structure, a Schottky barrier diode and a pn-junction diode are formed on a surface of a semiconductor substrate having an n-type layer of SiC formed thereon, and a common main electrode to the both diodes is formed on the surface. In the structure, the semiconductor substrate having an n-type layer of SiC formed on the surface is used and p-type regions are discontinusly formed on the surface. According to the structure, in a case where the forward surge current flows, holes are implanted from the p-type regions to the n-type layer, so that a surge tolerance dose is improved.

In the above structure, regarding a material of the electrode formed on the surface, a metal material Schottky-contacting the n-type SiC and ohmic-contacting the p-type SiC is ideal. However, it is difficult to actually obtain the material having the corresponding characteristic. Also, the contact state (Schottky, ohmic) with the semiconductor layer (n-type, p-type) depends on a heat treatment condition (a heat treatment temperature) after the formation of the electrode, and a combination of the material and the heat treatment condition for obtaining a favorable Schottky contact and a combination of the material and the heat treatment condition for obtaining a favorable ohmic contact are different. For this reason, it is very difficult to actually configure the main electrode with a single electrode material.

Therefore, according to the technology disclosed in JP-A-2011-165880, a Ti—Ni alloy is locally formed only on the p-type regions, and then it is subject to a heat treatment at high temperatures of 650° C. or higher to thus form ohmic electrodes. After that, a Mo alloy is formed to cover the ohmic electrodes and the n-type layer surface, which is then subject to a heat treatment at temperatures of 450° C. to 650° C. lower than the above heat treatment to thus form a Schottky electrode. FIG. 5 is a sectional view of a semiconductor device having the corresponding structure. Here, a semiconductor substrate 90 having p-type regions 92 formed on a surface of an n-type semiconductor layer 91 is used, and ohmic electrodes 93 are formed on the p-type regions 92. Then, a Schottky electrode 94 is formed to cover the exposed n-type semiconductor layer 91 and the ohmic electrodes 93. Actually, an Al alloy layer becoming a bonding pad or wiring layer is further formed thereon, as a main electrode (an anode electrode).

According to a method of manufacturing the above semiconductor device, since the process of forming the ohmic electrodes 93 is first performed at the higher heat treatment temperature, it is possible to obtain the ohmic electrodes 93 having a low contact resistance with the p-type regions 92 and the Schottky electrode 94 having a favorable Schottky characteristic with the n-type semiconductor layer 91, respectively. Also, since the ohmic electrodes 93 and the Schottky electrode 94 are made of metal, a contact resistance therebetween is low. Therefore, when the main electrode is formed on the Schottky electrode 94, a diode of an MPS structure having a favorable characteristic is obtained.

SUMMARY

According to the structure and the manufacturing method disclosed in JP-A-2011-165880, the Schottky electrode 94 is formed on the ohmic electrodes 94, and the heat treatment is performed at the temperatures of 450° C. or higher when forming the Schottky electrode 94. At this time, the Ti—Ni alloy configuring the ohmic electrodes 93 and the Mo alloy configuring the Schottky electrode 94 react each other at the temperatures of 450° C. or higher. For this reason, a reaction layer is formed at an interface of the Schottky 94 and the ohmic electrode 93 by the heat treatment for forming the Schottky electrode 94. When the reaction layer is formed, a density distribution is formed in the electrodes, and thus stress is generated, so that the interface of the Schottky 94 and the ohmic electrode 93 may be peeled off.

Also, the material forming the reaction layer is not limited to the material configuring the ohmic electrodes 93 and the material configuring the Schottky electrode 94. For example, when forming the ohmic electrodes 94 at a lower layer, the material (Si, C and the like) configuring the semiconductor substrate 90 may be separated on surfaces of the ohmic electrodes 93 due to a reaction. This material also forms the reaction layer, which may be a cause of the peeling. Further, not only the reaction layer but a natural oxide film, which is formed on a surface of the Ti—Ni alloy layer configuring the ohmic electrodes, may be a cause of the peeling.

Therefore, it is difficult to obtain a diode of an MPS structure having high reliability.

In view of the above, this disclosure is to provide at least the device and the manufacturing method of solving the above situations.

According to an aspect of the illustrative embodiments of this disclosure, this disclosure is configured as follows.

A semiconductor device of this disclosure includes a semiconductor substrate, on which a first semiconductor region having a first conductivity type is locally formed on a surface of a second semiconductor layer having a second conductivity type opposite to the first conductivity type; a main electrode, which is provided on a surface of the semiconductor substrate and which is connected to the first semiconductor region and the second semiconductor layer such that a pn-junction diode is formed with the first semiconductor region and a Schottky barrier diode is formed with the second semiconductor layer; a first electrode configured to ohmic-contact the first semiconductor region; a second electrode configured to Schottky-contact the second semiconductor layer and not having a portion directly contacting the first electrode; and a conductive reaction suppression layer configured to contact the first electrode and the second electrode and to suppress a reaction between a material configuring the first electrode and a material configuring the second electrode are provided on the surface of the semiconductor substrate, wherein the main electrode is electrically connected to the first electrode and the second electrode.

In the above-described semiconductor device, the semiconductor substrate may be made of silicon carbide.

In the above-described semiconductor device, the first electrode may be made of a material comprising at least one of Ni, Ti, Al, W and Ag.

In the above-described semiconductor device, the second electrode may be made of a material comprising at least one of Ni, Ti, Mo and V.

In the above-described semiconductor device, the first electrode and the second electrode may be not overlap with each other, as seen from a plan view, wherein the reaction suppression layer may be formed to cover the first electrode and the second electrode, and wherein the main electrode may be formed on the reaction suppression layer.

In the above-described semiconductor device, the reaction suppression layer may be made of a material comprising at least one of TiN, Ti, Mo and W.

In the above-described semiconductor device, the reaction suppression layer may be formed to cover the first electrode, the second electrode may formed to cover the reaction suppression layer, and the main electrode may be formed on the second electrode.

In the above-described semiconductor device, the reaction suppression layer may be made of a material comprising at least one of TiN, TaN, WN, TiSiN, TaSiN and WSiN.

A method of manufacturing above-described semiconductor device, may include: forming a material configuring the first electrode on the first semiconductor region and then performing a first heat treatment to form the first electrode; forming a material configuring the second electrode on the second semiconductor layer and then performing a second heat treatment at a temperature lower than the first heat treatment to form the second electrode, after the forming of the first electrode; forming the reaction suppression layer on the first electrode and the second electrode, and forming the main electrode on the reaction suppression layer.

A method of manufacturing above-described semiconductor device includes: forming a material configuring the first electrode on the first semiconductor region and then performing a first heat treatment to form the first electrode; forming the reaction suppression layer on the first electrode; forming a material configuring the second electrode on the second semiconductor layer and the reaction suppression layer and then performing a second heat treatment at a temperature lower than the first heat treatment to form the second electrode, after the forming of the reaction suppression layer, and forming the main electrode on the second electrode.

Since this disclosure is configured as described above, it is possible to obtain a diode of an MPS structure having high reliability.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, a semiconductor device and a method of manufacturing the same according to illustrative embodiments of this disclosure will be described. In the semiconductor device, a semiconductor substrate is used in which a first semiconductor region having a first conductivity type (an n-type or p-type) is formed on a surface of a second semiconductor layer having an opposite conductivity type (a second conductivity type). An ohmic electrode (a first electrode) configured to ohmic-contact the first semiconductor region is formed on the first semiconductor region. A Schottky electrode (a second electrode) configured to Schottky-contact the second semiconductor layer is formed on the surface of the second semiconductor layer. The ohmic electrode and the Schottky electrode are not directly contacted to each other and are coupled via a reaction suppression layer. On the structure, an anode electrode (one main electrode) configured to contact the ohmic electrode and the Schottky electrode is formed.

First Illustrative Embodiment

Figure 1:
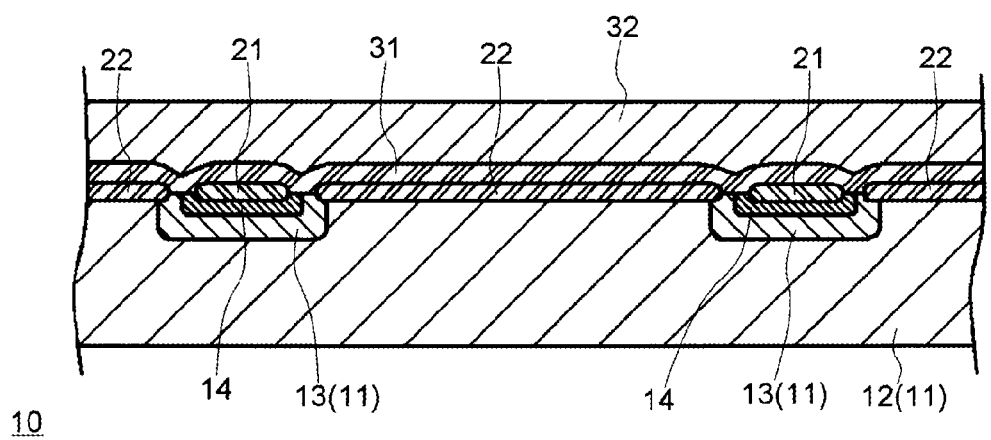
FIG. 1 is a sectional view of a semiconductor device according to a first illustrative embodiment of this disclosure.

FIG. 1 is a sectional view illustrating a structure of a semiconductor device 10 according to a first illustrative embodiment. The semiconductor device 10 is configured so that an ohmic electrode (a first electrode) and a Schottky electrode (a second electrode) do not overlap with each other, as seen from a plan view. However, both of the ohmic electrode and the Schottky are connected to a main electrode (an anode electrode).

Here, a semiconductor substrate 11 made of SiC is used. The semiconductor substrate 11 is provided on a surface thereof with an n-type semiconductor layer (a second semiconductor layer) 12. In the semiconductor substrate 11, an $n^+$-type layer and a cathode electrode (the other main electrode), which are not shown in FIG. 1, are also actually formed on a backside of the n-type semiconductor layer 12. P-type regions (a first semiconductor region) 13 are formed on a surface of the n-type semiconductor layer 12.

Also, a $p^+$ region 14 having a p-type of a high concentration is formed in the p-type region 13. Therefore, the portions at which the $p^+$-type regions 14 are exposed in the exposed p-type regions 13 are locally provided on the surface of the n-type semiconductor layer 12.

Here, an ohmic electrode (a first electrode) 21 is formed at the exposed portion of the $p^+$-type region 14. In the meantime, a Schottky electrode (a second electrode) 22 is formed at an exposed portion of the n-type semiconductor layer 12. Like the technology disclosed in JP-A-2011-165880, the ohmic electrode 21 is made of an alloy including nickel (Ni), titanium (Ti), aluminum (Al), tungsten (W) and silver (Ag) or an alloy of silicon (Si) and one or more elements selected from the corresponding elements. The Schottky electrode 22 is also made of an alloy including molybdenum (Mo), nickel (Ni), titanium (Ti) and vanadium (Vd), like the technology disclosed in JP-A-2011-165880. Thicknesses of the ohmic electrode 21 and the Schottky electrode 22 are respectively about 100 nm, for example.

Here, as seen from a plan view, the ohmic electrode 21 and the Schottky electrode 22 do not overlap with each other and are not directly contacted to each other. At this state, a reaction suppression layer 31 is formed to cover the ohmic electrode 21 and the Schottky electrode 22. The reaction suppression layer 31 has a barrier characteristic against the material configuring the ohmic electrode 21 to suppress a reaction between the material configuring the ohmic electrode 21 and the material configuring the Schottky electrode 22, and is made of a conductive material such as titanium nitride (TiN), Ti, Mo, W and the like. The reaction suppression layer 31 has a thickness capable of suppressing the diffusion of the constitutional element from the ohmic electrode 21 to the Schottky electrode 22, for example, about 30 nm. Further, a thick Al alloy film, for example, is formed on the reaction suppression layer 31, as an anode electrode (a main electrode) 32. The anode electrode 32 has a thickness enabling a bonding wire to be connected thereto, for example, about 5 μm. In the meantime, as the anode electrode 32, a two-layered structure having a bonding layer made of Ti and the like provided below the Al alloy layer may be also used.

Figure 2:
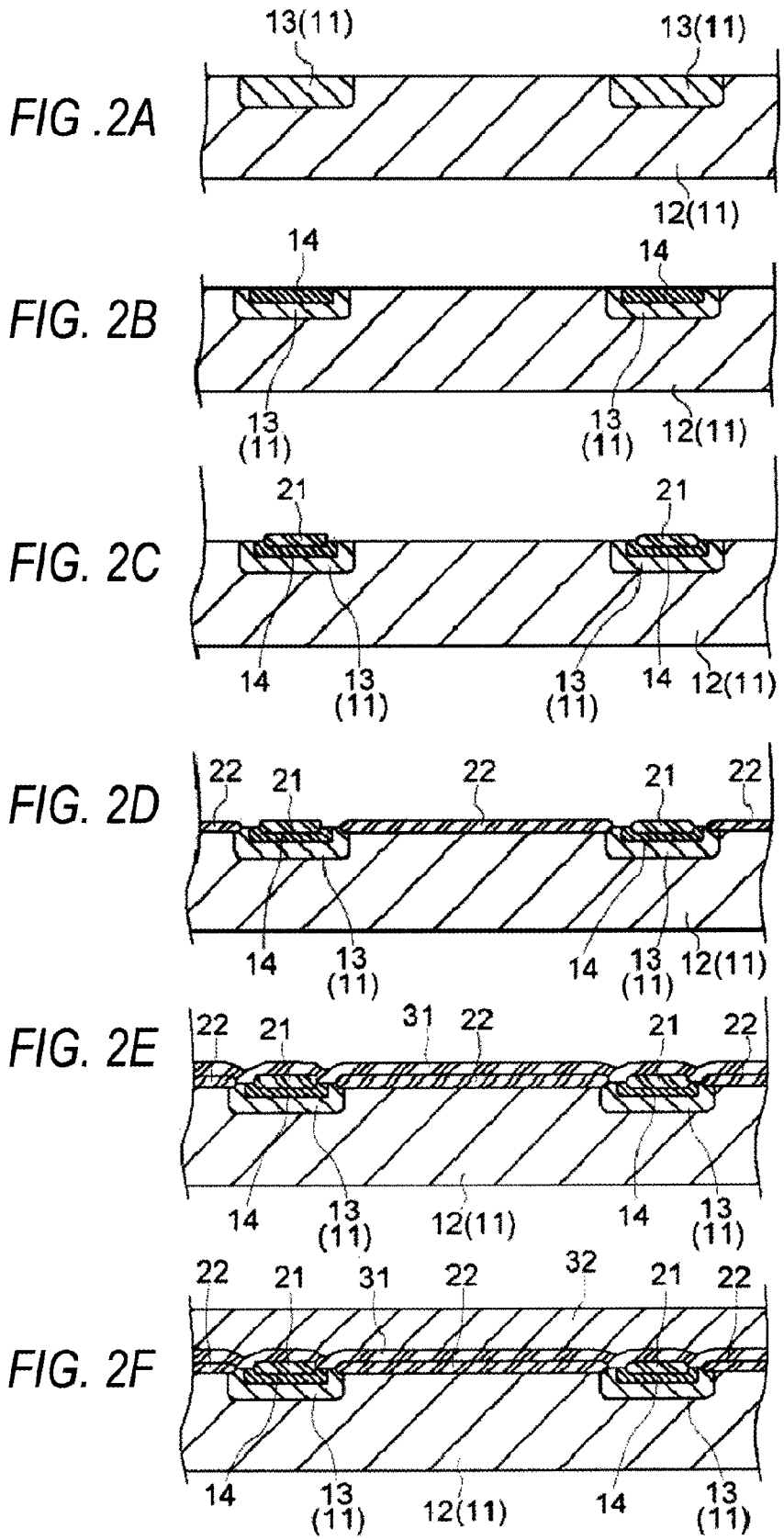
FIGS. 2A to 2F are process sectional views illustrating a method of manufacturing the semiconductor device according to the first illustrative embodiment of this disclosure.

FIGS. 2A to 2F are process sectional views illustrating a method of manufacturing the semiconductor device 10. As shown in FIG. 2A, the p-type regions (the first semiconductor region) 13 are formed in the n-type semiconductor layer (the second semiconductor layer) 12 made of SiC. The p-type regions 13 are formed by ion implanting an element such as Al, for example.

Next, as shown in FIG. 2B, the $p^+$ region 14 is formed in the p-type region 13. In this case, the same ion species as FIG. 2A is implanted with the lower energy and a higher dosage, so that the $p^+$ region 14 can be formed to be shallower than the p-type region 13. In the meantime, the p-type region 13 and the $p^+$ region 14 are not actually formed only by the ion implantation. That is, after the ion implantation, a heat treatment is performed at temperatures of about 1,800° C. to form the p-type region 13 and the $p^+$-type region 14. Therefore, the heat treatment is actually performed after the ion implantation for forming the $p^+$-type region 14, so that the p-type region 13 and the $p^+$region 14 are together formed. Also, the sequence of the twice ion implantations may be reversed and then the heat treatment may be performed.

Next, as shown in FIG. 2C, the ohmic electrode (the first electrode) 21 is locally formed on the $p^+$-type region 14 (a first electrode formation process). To this end, after a photoresist pattern having openings is formed on the $p^+$-type regions 14, the metal material configuring the ohmic electrode 21 is formed by vapor deposition and the like and then the photoresist layer and the metal material layer formed thereon are removed (a liftoff method). Alternatively, after the metal material layer is formed on the whole surface, a photoresist layer covering only the $p^+$-type regions 14 is formed and then the metal material layer is etched (an etching method). Even when any method is used, the heat treatment (a first heat treatment) is thereafter performed at temperatures of about 650° C. to 1,050°, so that the ohmic electrode 21 having a low contact resistance with the $p^+$region 14 is obtained.

Then, as shown in FIG. 2D, the Schottky electrode (the second electrode) 22 is formed on a surface of the n-type semiconductor layer 12 (a second electrode formation process). This formation method is the same as the formation method of the ohmic electrode 21, except that a material different from the ohmic electrode 21 is used and the temperature of the heat treatment (a second heat treatment) after the film formation is about 450° C. to 650° C. lower than the heat treatment (a first heat treatment) for the ohmic electrode 21. At this time, as shown, a patterning is performed so that the Schottky electrode 22 and the ohmic electrode 21 do not overlap with each other.

Thereafter, as shown in FIG. 2E, the reaction suppression layer 31 is formed to cover the entire surface (a reaction suppression layer formation process). Then, as shown in FIG. 2F, the anode electrode (the main electrode) 32 is formed. In the meantime, although not shown, a cathode electrode configured to ohmic-contact the n-type semiconductor layer 12 is also formed on a backside.

According to the above manufacturing method, after the ohmic electrodes 21 are formed, the Schottky electrodes 22 are formed. At this time, although the second heat treatment is performed, the ohmic electrode 21 and the Schottky electrode 22 are not directly contacted to each other at the time of the heat treatment. Therefore, a reaction layer, which is a cause of the peeling, is not formed between the ohmic electrode 21 and the Schottky electrode 22. After that, the ohmic electrode 21 and the Schottky electrode 22 are connected by the reaction suppression layer 31. After the reaction suppression layer 31 is formed, the heat treatment is not performed at the temperatures higher than at least 450° C. Even when the heat treatment is performed, the mutual diffusion or reaction of the elements configuring the ohmic electrode 21 and Schottky electrode 22 is suppressed by the reaction suppression layer 31. For this reason, the semiconductor device 10 becomes an MPS-type diode having high reliability. Also, the semiconductor device 10 can be easily manufactured by the manufacturing method shown in FIG. 2.

Second Illustrative Embodiment

Figure 3:
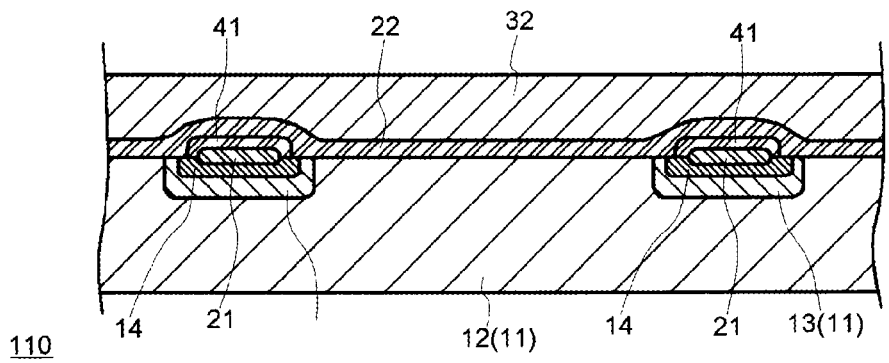
FIG. 3 is a sectional view of a semiconductor device according to a second illustrative embodiment of this disclosure.

FIG. 3 is a sectional view illustrating a structure of a semiconductor device 110 according to a second illustrative embodiment. In the semiconductor device 110, an ohmic electrode and a Schottky electrode overlap with each other, as seen from a plan view. However, a reaction suppression layer is provided therebetween, so that the ohmic electrode, and the Schottky are not directly contacted to each other.

Regarding the structure below the ohmic electrodes 21, the semiconductor device 110 is the same as the semiconductor device 10. However, in the semiconductor device 110, a reaction suppression layer 41 is locally formed to cover only the ohmic electrodes 21. The Schottky electrode 22 is formed to cover the semiconductor substrate 11 exposed on the surface and the reaction suppression layer 41 over the entire surface. The anode electrode 32 is formed on the entire surface of the Schottky electrode 22.

Figure 4A:
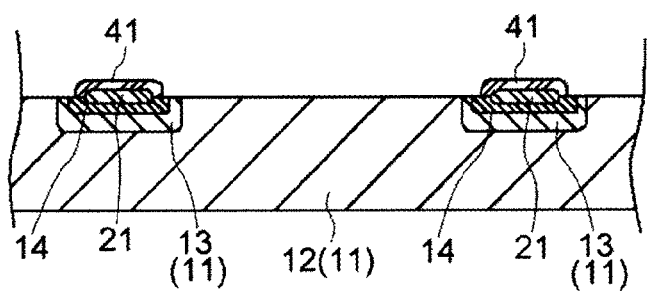
FIGS. 4A to 4C are process sectional views illustrating a method of manufacturing the semiconductor device according to the second illustrative embodiment of this disclosure.
Figure 4B:
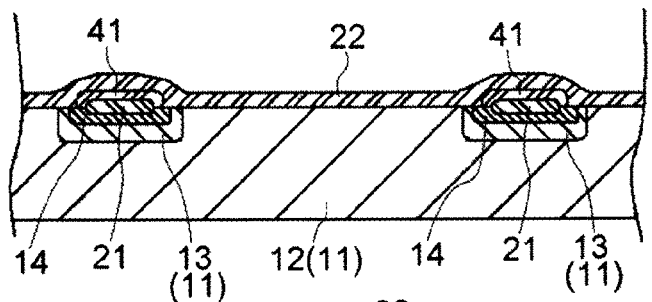
Figure 4C:
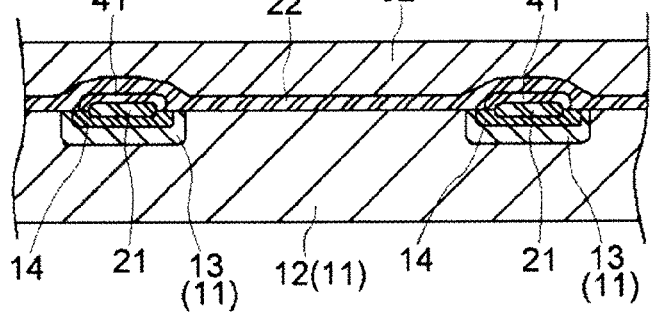
Figure 5:
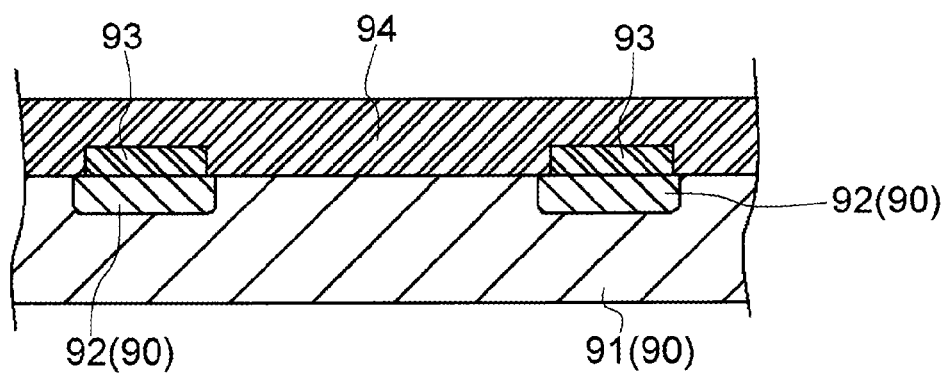
FIG. 5 is a sectional view illustrating a structure of an MPS-type semiconductor device according to the background art.

FIGS. 4A to 4C are process sectional views illustrating a method of manufacturing the semiconductor device 110. Because the processes up to the formation of the ohmic electrodes 21 (the first electrode formation process) are the same as FIGS. 2A to 2F, FIGS. 4A to 4C illustrate processes of forming the reaction suppression layer 41 (FIG. 4A: a suppression layer formation process) and thereafter C.

As shown in FIG. 4A, after the first electrode formation process, the reaction suppression layer 41 is formed to cover the ohmic electrodes (the first electrode) 21 (a suppression layer formation process). The reaction suppression layer 41 is patterned in the same manner as the ohmic electrodes 21 and the like.

Thereafter, as shown in FIG. 4B, the Schottky electrode (the second electrode) 22 is formed to cover the n-type semiconductor layer 12 and the reaction suppression layer 41 (a second electrode formation process). At this time, in the reaction suppression layer formation process, the reaction suppression layer 41 is formed to only the ohmic electrodes 21, so that it is possible to increase a contact area of the Schottky electrode 22 and the n-type semiconductor layer 12. After that, as shown in FIG. 4C, the anode electrode (the main electrode) 32 is formed to cover the Schottky electrode 22.

Also in the above structure and manufacturing method, the reaction suppression layer 41 is formed to suppress the reaction between the ohmic electrode 21 and the Schottky electrode 22. As the material configuring the reaction suppression layer 41 used in this illustrative embodiment, a conductive material capable of suppressing the reaction between the ohmic electrode 21 and the Schottky electrode 22 is used, like the reaction suppression layer 31. However, since the second electrode formation process is performed and then the second heat treatment is performed after the reaction suppression layer 41 is formed, it is required to suppress the reaction between the ohmic electrode 21 and the Schottky electrode 22 at the temperatures (for example, 450° C. to 650° C.) of the heat treatment. Also, it is required that the peeling should not occur at an interface between the ohmic electrode 21 and the Schottky electrode 22. As a material satisfying the requirements, TiN, tantalum nitride (TaN), tungsten nitride (WN), TiSiN, TaSiN, WSiN and the like can be used as the material of the reaction suppression layer 41.

Meanwhile, in the above configuration, it is obvious that even when the conductivity types (the p-type and the n-type) are reversed, the same effects can be realized by the same configuration. Also, in the above illustrative embodiments, the semiconductor substrate is made of SiC. However, it is obvious that even when a semiconductor substrate made of other semiconductor materials is used, the same effects can be realized.

Also, in the above illustrative embodiments, the configuration where the one main electrode is connected to the surface of the semiconductor substrate has been described. However, a method of taking out the other main electrode is arbitrary. Also, the configuration of the main electrode formed on the surface is arbitrary.

What is claimed is:

1. A semiconductor device comprising:
   a semiconductor substrate, on which a semiconductor region having a first conductivity type is locally formed on a surface of a semiconductor layer having a second conductivity type opposite to the first conductivity type;
   a main electrode, which is provided on a surface of the semiconductor substrate and which is connected to the semiconductor region and the semiconductor layer such that a pn-junction diode is formed with the semiconductor region and a Schottky barrier diode is formed with the semiconductor layer;
   a first electrode configured to ohmic-contact the semiconductor region;
   a second electrode configured to Schottky-contact the semiconductor layer and not having a portion directly contacting the first electrode; and
   a conductive reaction suppression layer configured to contact the first electrode and the second electrode and to suppress a reaction between a material configuring the first electrode and a material configuring the second electrode are provided on the surface of the semiconductor substrate,
   wherein the main electrode is electrically connected to the first electrode and the second electrode.

2. The semiconductor device according to claim 1, wherein the semiconductor substrate is made of silicon carbide.

3. The semiconductor device according to claim 2, wherein the first electrode is made of a material comprising at least one of Ni, Ti, Al, W and Ag.

4. The semiconductor device according to claim 2, wherein the second electrode is made of a material comprising at least one of Ni, Ti, Mo and V.

5. The semiconductor device according to claim 1, wherein the first electrode and the second electrode do not overlap with each other, as seen from a plan view,
   wherein the reaction suppression layer is formed to cover the first electrode and the second electrode, and
   wherein the main electrode is formed on the reaction suppression layer.

6. The semiconductor device according to claim 5, wherein the reaction suppression layer is made of a material comprising at least one of TiN, Ti, Mo and W.

7. The semiconductor device according to claim 1, wherein the reaction suppression layer is formed to cover the first electrode, the second electrode is formed to cover the reaction suppression layer, and
   wherein the main electrode is formed on the second electrode.

8. The semiconductor device according to claim 7, wherein the reaction suppression layer is made of a material comprising at least one of TiN, TaN, WN, TiSiN, TaSiN and WSiN.

* * * * *